(12) United States Patent
Kondo

(10) Patent No.: US 11,397,214 B2
(45) Date of Patent: Jul. 26, 2022

(54) METHODS AND APPARATUS FOR A BATTERY

(71) Applicant: SEMICONDUCTOR COMPONENTS INDUSTRIES, LLC, Phoenix, AZ (US)

(72) Inventor: Hideo Kondo, Oizumi-Machi (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 219 days.

(21) Appl. No.: 16/745,458

(22) Filed: Jan. 17, 2020

(65) Prior Publication Data
US 2021/0223324 A1   Jul. 22, 2021

(51) Int. Cl.
| | |
|---|---|
| G01R 31/3842 | (2019.01) |
| H02J 7/00 | (2006.01) |
| G01R 31/36 | (2020.01) |
| H01M 10/48 | (2006.01) |
| H01M 10/42 | (2006.01) |

(52) U.S. Cl.
CPC ..... *G01R 31/3842* (2019.01); *G01R 31/3648* (2013.01); *H01M 10/4285* (2013.01); *H01M 10/48* (2013.01); *H02J 7/0048* (2020.01)

(58) Field of Classification Search
None
See application file for complete search history.

(56) References Cited

U.S. PATENT DOCUMENTS

| | | | |
|---|---|---|---|
| 2003/0097225 A1 | 5/2003 | Teruo | |
| 2014/0074416 A1* | 3/2014 | Park | G01R 31/3842 |
| | | | 702/63 |
| 2015/0377974 A1 | 12/2015 | Choi | |
| 2016/0131720 A1 | 5/2016 | Kansei | |
| 2016/0294198 A1* | 10/2016 | Poulis | H02J 7/0021 |
| 2018/0050681 A1* | 2/2018 | Ohkawa | B60W 20/13 |
| 2018/0143254 A1* | 5/2018 | Kim | G01R 31/392 |
| 2021/0116510 A1* | 4/2021 | Kim | G01R 31/3835 |

OTHER PUBLICATIONS

Lai, Xin et al., A State of Charge Estimator Based Extended Kalman Filter Using an Electrochemistry-based Equivalent Circuit Model for Lithium-ion Batteries, article, Sep. 8, 2018, 8, 1592, MDPI, Shanghai, China.
Sepasi, Saeed, et al., Improved extended Kalman filter for state of charge estimation of battery pack, Journal of Power Sources, 2014, pp. 368-376, 255, Elsevier.
Ding, Ning, et al., State of Charge Estimation of a Composite Lithium-based Battery Model Based on an Improved Extended Kalman Filter Algorithm, article, Nov. 1, 2019, 4, 66, MDPI, China.
Taborelli, Carlo, et al., State of Charge Estimation Using Extended Kalman Filters for Battery Management System, IEEE International Electric Vehicle Conference, 2014, IEEE, Florence, Italy.

* cited by examiner

*Primary Examiner* — Brent A. Fairbanks
(74) *Attorney, Agent, or Firm* — Dickinson Wright PLLC

(57) ABSTRACT

Various embodiments of the present technology may provide methods and apparatus for a battery. The apparatus may determine a first current according to a first technique and a second current according to a second technique. The apparatus may use a Kalman filter to compute the state of charge of the battery, wherein the Kalman filter uses one of the first current and the second current based on a comparison of the second current to a threshold current.

20 Claims, 9 Drawing Sheets

| IDD2 | VTH |
|---|---|
| [A] | [mV] |
|  |  |
| 0.1 | 13 |
| 0.25 | 31 |
| 0.5 | 63 |
| 0.75 | 94 |
| 1 | 125 |
| 1.25 | 156 |
| 1.5 | 188 |
| 1.75 | 219 |
| 1.8 | 225 |
| 1.9 | 238 |
| 2 | 250 |
| 2.1 | 263 |
| 3 | 375 |
| 4 | 500 |
| 5 | 625 |
| 10 | 750 |
| 20 | 1000 |
| 30 | 1500 |

FIG.7

METHODS AND APPARATUS FOR A BATTERY

BACKGROUND OF THE TECHNOLOGY

"Battery capacity" is a measure (typically in ampere-hours) of the charge stored by the battery and is determined by the mass of active material contained in the battery. The battery capacity represents the maximum amount of energy that can be extracted from the battery under certain specified conditions. The battery capacity can also be represented as a percentage and referred to as a state of charge or relative state of charge (RSOC).

A fuel gauge is typically provided to measure various parameters of the battery and monitor the state of charge of the battery. A current of the battery (based on the internal resistance of the battery) is typically used to determine the state of charge. However, during periods of high current, the measured current may contain errors, which may result in an inaccurate state of charge.

SUMMARY OF THE INVENTION

Various embodiments of the present technology may provide methods and apparatus for a battery. The apparatus may determine a first current according to a first technique and a second current according to a second technique. The apparatus may use a Kalman filter to compute the state of charge of the battery, wherein the Kalman filter uses one of the first current and the second current based on a comparison of the second current to a threshold current.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

FIG. 7 is a look-up table in accordance with an exemplary embodiment of the present technology.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage sensors, current sensors, coulomb counters, logic gates, timers, memory devices, switches, semiconductor devices, such as transistors and capacitors, and the like, which may carry out a variety of functions. In addition, the present technology may be integrated in any number of electronic systems, such as automotive, aviation, "smart devices," portables, e-cigarettes, aroma therapy puff systems, vaping devices, and consumer electronics, and the systems described are merely exemplary applications for the technology.

Figure 1:
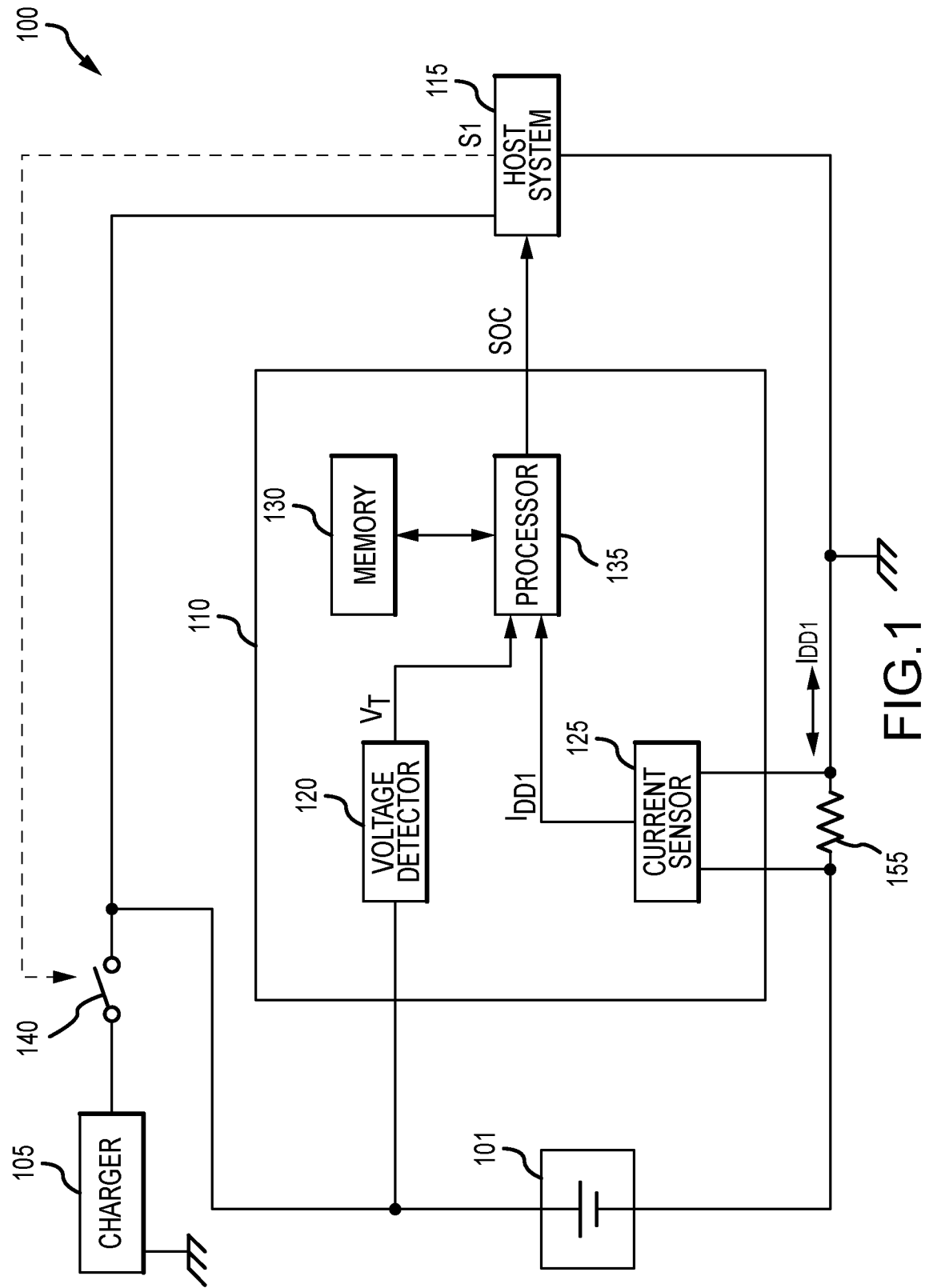
FIG. 1 is a block diagram of a battery system in accordance with an exemplary embodiment of the present technology.

Methods and apparatus for a battery according to various aspects of the present technology may operate in conjunction with any suitable electronic system and/or device, such as "smart devices," wearables, battery-powered consumer electronics, portable devices, battery-powered vehicles, and the like. Referring to FIG. 1, an exemplary system 100 may be integrated in an electronic device (not shown), such as a vaping device or an electric vehicle, powered by a rechargeable battery 101, such as a lithium ion battery. For example, in various embodiments, the battery 101 may operate in conjunction with a charger 105 and a fuel gauge circuit 110 to provide power to a host system 115 (i.e., a load).

According to an exemplary embodiment, the system 100 may comprise a switch 140 to selectively connect the charger 105 to the battery 101. According to an exemplary embodiment, the host system 115 may operate the switch 140 according to a control signal S1 that is pulse-width modulated. The switch 140, in conjunction with the control signal S1, may control current flow from the charger 105 to the battery 101 (also referred to as a charge current $I_{CC}$), and thus control charge and discharge cycles of the battery 101.

The fuel gauge circuit 110 may be configured to manage various battery operations and monitor various battery conditions. For example, the fuel gauge circuit 110 may be configured to measure a voltage $V_T$ of the battery 101, measure a first current $I_{DD1}$ (also referred to as a load current $I_{DD1}$), compute a remaining capacity (also expressed as a percentage and referred to as the state of charge SOC) of the battery 101, compute a state of health (SOH) of the battery 101, estimate a lifespan of the battery 101, determine an energy capability of the battery, and the like.

In addition, the fuel gauge circuit 110 may be configured to store various battery data. For example, the fuel gauge circuit 110 may store predetermined battery characteristics, such as open circuit voltage values of the battery 101 as a function of the capacity (i.e., SOC) of the battery 101. The fuel gauge circuit 110 may also store predetermined values, such as predetermined threshold voltage values $V_{TH}$ and a predetermined current value $I_{TH}$, and/or other battery characteristic data.

In an exemplary embodiment, the fuel gauge circuit 110 may comprise a voltage detector 120 to measure or otherwise detect the voltage $V_T$ of the battery 101. The voltage detector 120 may be connected to the battery 101 and may comprise any circuit and/or device suitable for measuring a voltage potential.

In an exemplary embodiment, the fuel gauge circuit 110 may further comprise a current sensor 125 to measure the load current $I_{DD1}$ to/from the battery 101 and the host system 115. The current sensor 125 may comprise any circuit and/or device suitable for measuring the current of the battery 101. For example, the current sensor 125 may operate in conjunction with a sense resistor 155, wherein the current senor 125 measures the voltage across the sense resistor 155 to determine the load current $I_{DD1}$.

In an exemplary embodiment, the fuel gauge circuit 110 may further comprise a memory 130 to store the known battery characteristics and/or profile data of the battery 101, such as open circuit voltage characteristics of battery 101. The open circuit voltage characteristics may provide open circuit voltage $V_{OC}$ values as a function of the remaining capacity (RSOC) of the battery 101. The open circuit voltage characteristics may be predetermined by testing the battery 101 under open circuit (i.e., no load) conditions and may be stored in a look-up table or any other data storage suitable for storing relational data.

The memory 130 may also store various previously- and currently-computed or measured variables, such as the battery voltage $V_T$, current $I_{DD1}$, and the like. The memory 130 may also store pre-defined variables, such as the threshold voltage $V_{TH}$ values according to current values. For example, the memory 130 may contain a look-up table of threshold voltages $V_{TH}$ and corresponding current values (e.g., as illustrated in FIG. 7), wherein a threshold voltage from the table may be selected according to a known current value. In addition, the memory 130 may contain a look-up table (not shown) of current values (referred to as second current values $I_{DD2}$) and difference voltages $V_{DIFF}$ (i.e., $\Delta V$), wherein a second current $I_{DD2}$ from the table may be selected according to a known difference voltage $V_{DIFF}$.

In an exemplary embodiment, the memory 130 may further comprise a look-up table containing open circuit voltage values ($V_{OC}$) as a function of RSOC (relative state of charge) values (where the relative state of charge is the battery capacity represented as a percentage).

The memory 130 may comprise any number of storage devices, such as registers, a flash memory device, EEPROM (electrically erasable programmable read-only memory), ROM (read only memory), and RAM (random access memory), and the like.

In various embodiments, the fuel gauge circuit 110 may further comprise a remaining capacity calculation circuit (not shown) configured to measure the RSOC of the battery 101. In one embodiment, the remaining capacity calculation circuit may be configured to determine the RSOC according to the voltage $V_T$ of the battery 101. In general, utilizing the voltage $V_T$ of battery to determine the remaining capacity is referred to as "the voltage method."

In an alternative embodiment, the remaining capacity calculation circuit may be configured to measure the in-and-out-flowing current $I_{DD}$ of the battery 101 over a period of time and reporting the accumulated charge. This may be accomplished using the current sensor 125 and tracking the measured current $I_{DD1}$. In the present embodiment, the remaining capacity calculation circuit monitors the voltage across the sense resistor 1555 as the battery 101 charges and discharges as an indication of the current $I_{DD}$. The current $I_{DD1}$ is then integrated over some period of time and reported as the remaining capacity (in mAh or as a percentage). In general, utilizing the current $I_{DD1}$ to determine the remaining capacity is referred to as "coulomb counting."

Figure 2:
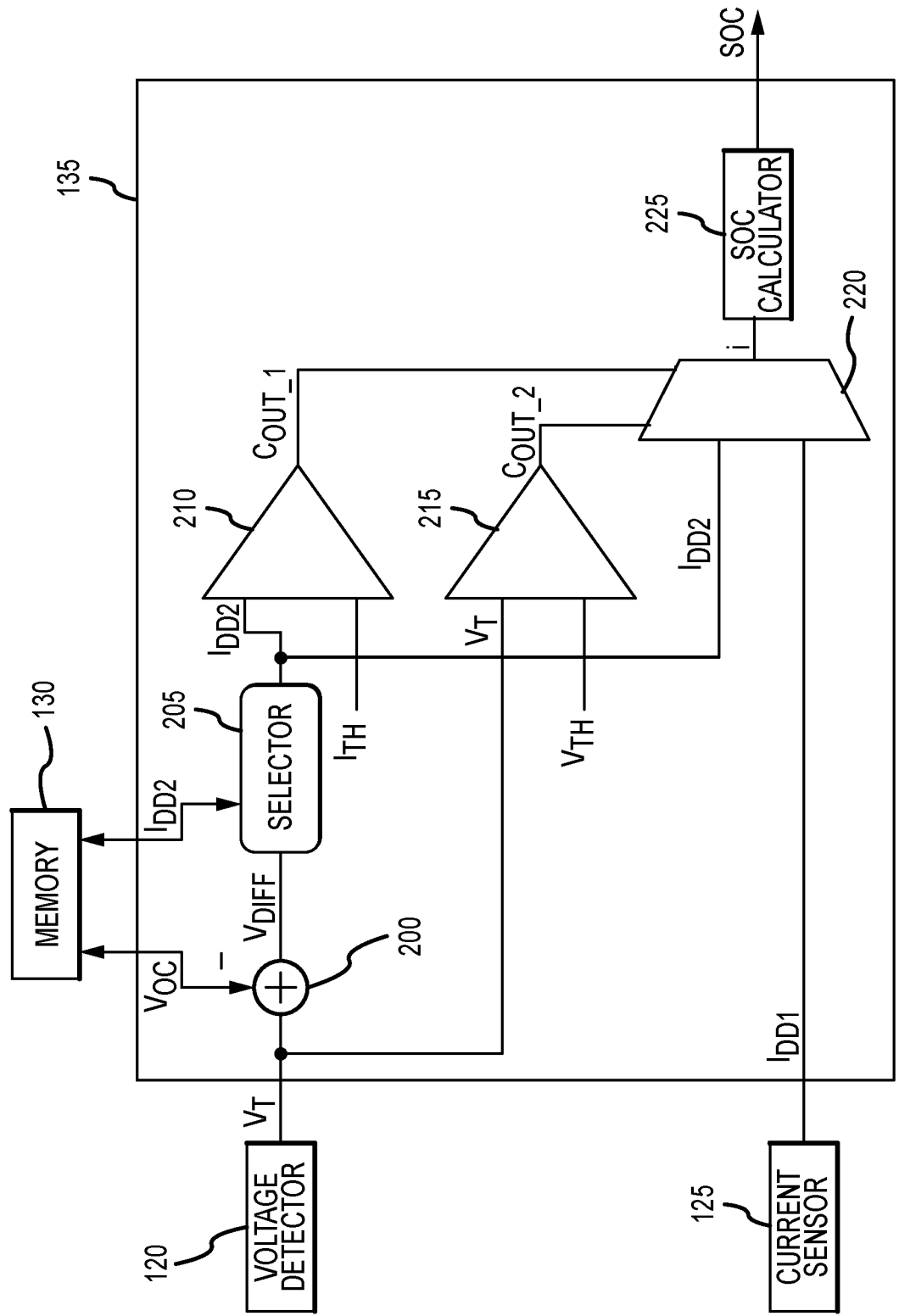
FIG. 2 is a simplified circuit diagram of a logic circuit in accordance with an exemplary embodiment of the present technology.

In an exemplary embodiment, the fuel gauge circuit 110 may comprise the processor 135, wherein the processor 135 may perform various computations and comparison, and determine a state of charge (SOC) of the battery 101. For example, and as shown in FIG. 2, the processor 135 may comprise an arithmetic circuit 200, a selector circuit 205, a first comparator circuit 210, and a multiplexer 220. The processor 135 may be further configured to access various data from the memory 130.

According to an exemplary embodiment, the arithmetic circuit 200 may be configured to perform a subtraction function. In an exemplary embodiment, and as shown in FIG. 2, the arithmetic circuit 200 may compute a difference voltage $V_{DIFF}$ by subtracting the open circuit voltage $V_{OC}$ from the battery voltage $V_T$. The arithmetic circuit 200 may be in communication with the memory 130 and configured to receive or otherwise retrieve the open circuit voltage $V_{OC}$ from the memory 130 according to the computed RSOC. The arithmetic circuit 200 may transmit the difference voltage $V_{DIFF}$ to the selector circuit 205.

The selector 205 may be configured to receive the difference voltage $V_{DIFF}$ and select a corresponding second current $I_{DD2}$. For example, and as shown in FIG. 2, the selector 205 may retrieve or otherwise receive the second current $I_{DD2}$ from the memory 130 based on the value of the difference voltage $V_{DIFF}$. For example, if the difference voltage $V_{DIFF}$ is 20 mV, then the corresponding second current $I_{DD2}$ may be 0.25 A. The selector 205 may transmit the corresponding second current $I_{DD2}$ to the first comparator 210.

Alternatively, the system 100 may determine the second current $I_{DD2}$ by directly computing it based on the difference voltage $V_{DIFF}$ and a known internal battery resistance R, where $I_{DD2}=V_{DIFF}/R$.

The first comparator 210 may compare the second current $I_{DD2}$ to a predetermined threshold current $I_{TH}$ and generate a first comparator output $C_{OUT\_1}$ according to the comparison. For example, the first comparator 210 may receive the second current $I_{DD2}$ at a first input terminal and the threshold current $I_{TH}$ at a second input terminal. If the second current $I_{DD2}$ is greater than the threshold current $I_{TH}$, then the first comparator 210 may generate a first output (such as a logic 1). If the second current $I_{DD2}$ is less than the threshold current $I_{TH}$, then the first comparator 210 may generate a second output (such as a logic 0). The first comparator 210 may transmit the first comparator output $C_{OUT\_1}$ to the multiplexer 220, wherein the first comparator output $CO_{UT\_}$may serve as a first enable signal for the multiplexer 220.

According to various embodiments, the value of the threshold current $I_{TH}$ may be selected based on various specifications of the battery 101. In one embodiment, the threshold current $I_{TH}$ may be 2 A.

The second comparator 215 may compare the battery voltage $V_T$ to a predetermined threshold voltage $V_{TH}$ and generate a second comparator output $C_{OUT\_2}$ according to the comparison. For example, and as shown in FIG. 2, the second comparator 215 may receive the battery voltage $V_T$ at a first input terminal and the threshold voltage $V_{TH}$ at a second input terminal. If the battery voltage $V_T$ is greater than the threshold voltage $V_{TH}$, then the second comparator 215 may generate a first output (such as a logic 1). If the battery voltage $V_T$ is less than the threshold voltage $V_{TH}$, then the second comparator 215 may generate a second output (such as a logic 0). The second comparator 215 may transmit the second comparator output $C_{OUT\_2}$ to the multiplexer 220, wherein the second comparator output $C_{OUT\_2}$ may serve as a second enable signal for the multiplexer 220.

The multiplexer 220 may be configured to select and output one of the first current $I_{DD1}$ and the second current $I_{DD2}$ based on at least one of the first comparator output $C_{OUT\_1}$ and the second comparator output $C_{OUT\_2}$. The output of the multiplexer 220 may be referred to generally as the selected current i, where i is $I_{DD1}$ or $I_{DD2}$.

For example, according to a first embodiment, the multiplexer 220 may select and output the first current $I_{DD1}$ if the second current $I_{DD2}$ is greater than or equal to threshold current $I_{TH}$. Alternatively, the multiplexer 220 may select and output the second current $I_{DD2}$ if the second current $I_{DD2}$ is less than the threshold current $I_{TH}$.

According to a second embodiment, the multiplexer 220 may select and output the second current $I_{DD2}$ if the second current $I_{DD2}$ is greater than or equal to the threshold current $I_{TH}$ and the difference voltage $V_{DIFF}$ is less than the threshold voltage $V_{TH}$. Alternatively, the multiplexer 220 may select and output the first current $I_{DD1}$ if the second current $I_{DD2}$ is less than the threshold current $I_{TH}$ and the difference voltage $V_{DIFF}$ is greater than the threshold voltage $V_{TH}$.

According to various embodiments, the processor 135 may comprise any number of circuits, systems, logic gates, and/or software to perform the desired computations and/or selections, as described above. For example, the processor 135 may comprise a field programmable gate array, an application specific integrated circuit, programs and operating information, and the like.

In various embodiments, the processor 135 may further comprise a module and/or circuit to determine the remaining capacity (measured in ampere-hours) and/or the SOC (the remaining capacity represented as a percentage) according to the selected current i. In general, the SOC of the battery 101 may be represented according to the following:

$$SOC_t = SOC_{t_o} + \frac{\int_{x_o}^{x} i \, dt}{C_{OCV}}, \quad \text{(Equation 1)}$$

where $SOC_{t_0}$ is an initial SOC value and $C_{OCV}$ is a reference capacity of the battery 101.

Figure 4A:
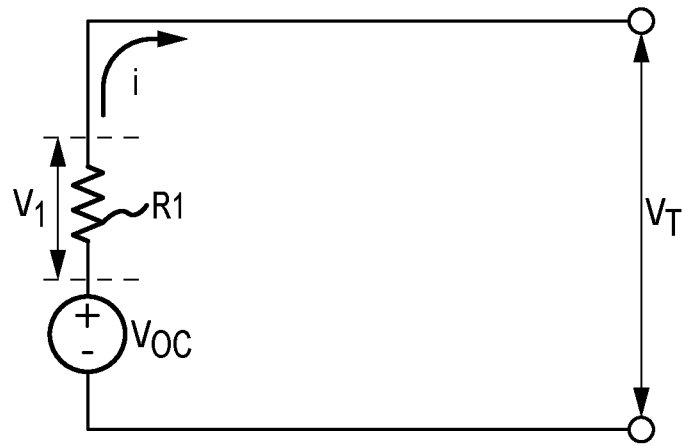
FIG. 4A is a circuit model of a battery in accordance with an exemplary embodiment of the present technology.

In a first embodiment, and referring to FIGS. 2 and 4A, the battery 101 may be modeled according to an open circuit voltage $V_{OC}$, an ohmic resistance, represented by a first resistor R1, voltage across the first resistor $V_1$, output voltage $V_T$, and current i. Characteristics of the present battery model may be represented according to the following:

$$V_T = V_{OC} - V_1 = V_{OC} - R1 \cdot i \quad \text{(Equation 2)}$$

In the present embodiment, the SOC calculator 225 may compute the SOC according to the following equation:

$$SOC_t = SOC_{t-\Delta t} + \frac{i_t \times \Delta t}{C_{OCV}}, \quad \text{(Equation 3)}$$

where $\Delta t$ is the sampling period.

Figure 4B:
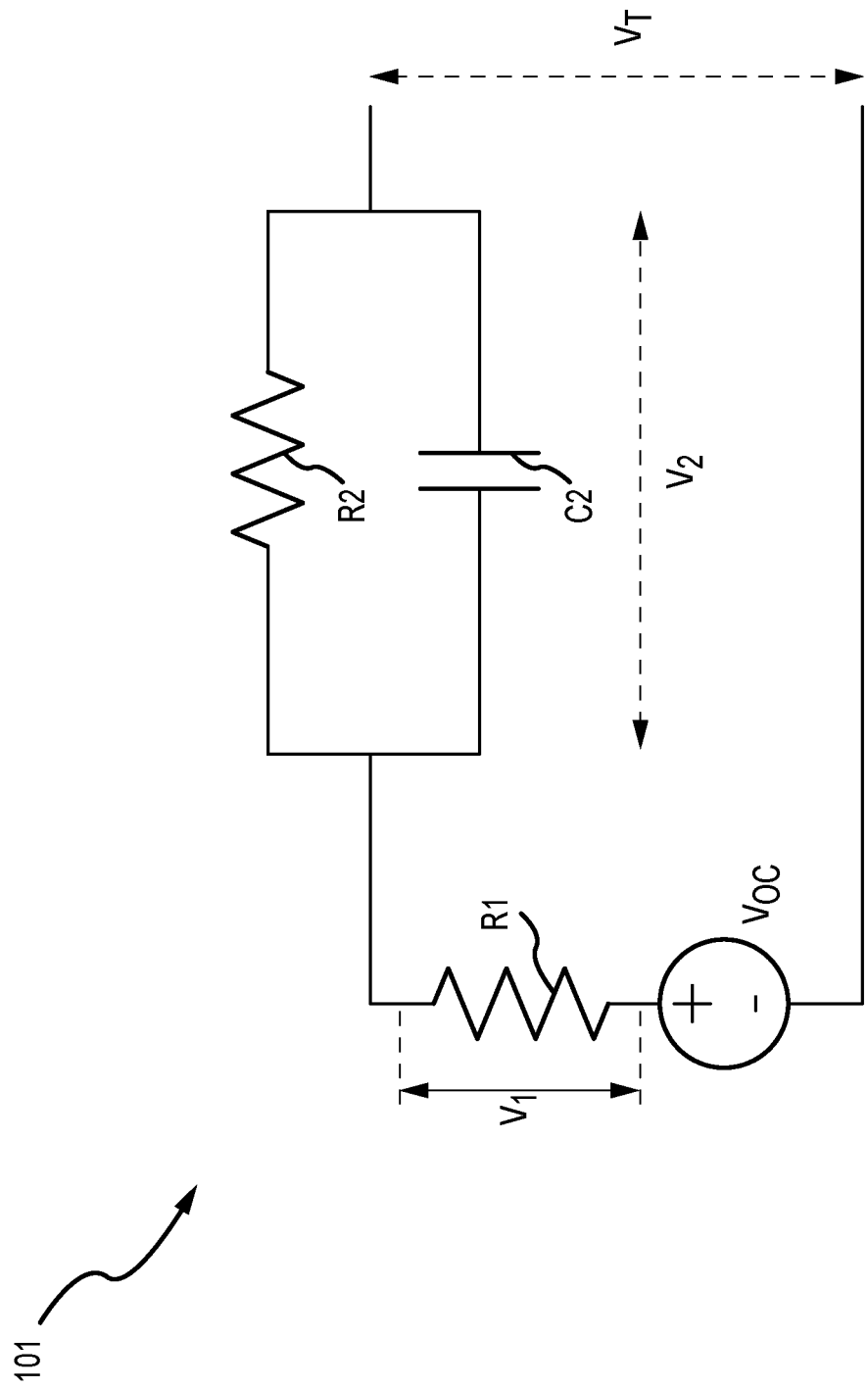
FIG. 4B is an alternative circuit model of a battery in accordance with an exemplary embodiment of the present technology.
Figure 8:
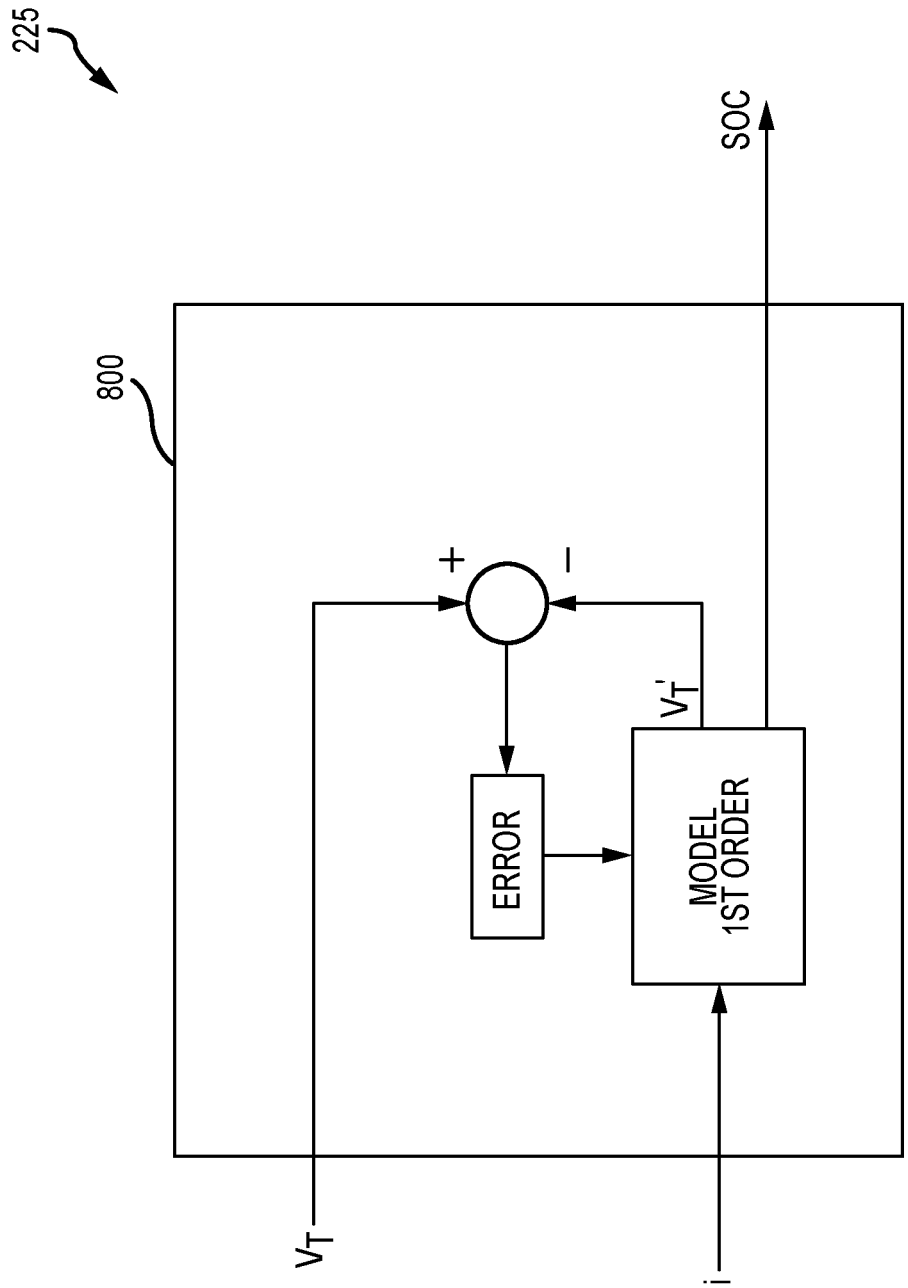
FIG. 8 is a block diagram of a SOC calculator in accordance with an exemplary embodiment of the present technology.

In an alternative embodiment, and referring to FIGS. 4B and 8, the SOC calculator 225 may comprise a Kalman filter 800 to determine the SOC by performing a prediction and correction algorithm using one or more battery variables, such as a current and a voltage of the battery. The Kalman filter 800 may be able to minimize, in real time, the errors between estimated and measured outputs, using a feedback that adjusts/corrects the uncertain variables of the model. With this model, the Kalman filter 800 may enable the system to observe physical parameters of the model that cannot be measured directly.

In general, the Kalman filter addresses the problem of trying to estimate the state $x \in \Re^n$ of a discrete-time controlled process that is governed by the linear stochastic difference equation $$x_k = Ax_{k-1} + Bu_{k-1} + w_{k-1} \quad (1.1)$$

with a measurement $Z \in \Re^m$ that is $$z_k = Hx_k + v_k \quad (1.2)$$

The random variables $w_k$ and $v_k$ represent the process and measurement noise (respectively). They are assumed to be independent (of each other), and with normal probability distributions:

$$p(w) \sim N(0, Q) \quad (1.3)$$

$$p(v) \sim N(0, R) \quad (1.4)$$

In practice, the process noise covariance Q and measurement noise covariance R matrices might change with each time step or measurement, however it is assumed they are constant.

The n×n matrix A in the difference equation (1.1) relates the state at the previous time step k−1 to the state at the current step k, in the absence of either a driving function or process noise. Note that in practice A might change with each time step, but here it is assumed it is constant.

The n×l matrix B relates the optional control input $u \in \Re^l$ to the state x.

The m×n matrix H in the measurement equation (1.2) relates the state to the measurement $z_k$. In practice H might change with each time step or measurement, but here it is assumed it is constant.

The expression $\hat{x}_k^- \in \Re^n$ (note the "super minus") is defined as the a priori state estimate at step k given knowledge of process prior to step k, and the expression $\hat{x}_k \in \Re^n$ is defined as the a posteriori state estimate at step k given measurement $z_k$.

Therefore, the a priori and a posteriori estimate errors are defined as:

$$e_k^- \equiv x_k - \hat{x}_k^-, \text{ and}$$

$$e_k \equiv x_k - \hat{x}_k$$

The a priori estimate error covariance is given by $$P_k^- = E[e_k^- e_k^{-T}] \quad (1.5),$$

and the a posteriori estimate error covariance is given by $$P_k = E[e_k e_k^T] \quad (1.6),$$

In deriving the equations for the Kalman filter, the goal is to find an equation that computes an a posteriori state estimate $\hat{x}_k$ as a linear combination of an a priori estimate $\hat{x}_k^-$ and a weighted difference between an actual measurement $z_k$ and a measurement prediction $H\hat{x}_k^-$ as shown below in (1.7). Some justification for (1.7) is given in "The Probabilistic Origins of the Filter" found below.

$$\hat{x}_k = \hat{x}_k^- + K(z_k - H\hat{x}_k^-) \quad (1.7)$$

The difference $(z_k - H\hat{x}_k^-)$ in (1.7) is called the measurement innovation, or the residual.

The residual reflects the discrepancy between the predicted measurement $H\hat{x}_k^-$ and the actual measurement $z_k$. A residual of zero means that the two are in complete agreement.

The n×m matrix K in (1.7) is chosen to be the gain or blending factor that minimizes the a posteriori error covariance (1.6). This minimization can be accomplished by first substituting (1.7) into the above definition for $e_k$, substituting that into (1.6), performing the indicated expectations, taking the derivative of the trace of the result with respect to K, setting that result equal to zero, and then solving for K.

One form of the resulting K that minimizes (1.6) is given by $$K_k = P_k^- H^T (H P_k^- H^T + R)^{-1} = \frac{P_k^- H^T}{H P_k^- H^T + R} \quad (1.8)$$

Looking at (1.8) it is observed that as the measurement error covariance R approaches zero, the gain K weights the residual more heavily. Specifically, $$\lim_{R_k \to 0} K_k = H^{-1}$$

On the other hand, as the a priori estimate error covariance $P_k^-$ approaches zero, the gain K weights the residual less heavily. Specifically, $$\lim_{P_k^- \to 0} K_k = 0$$

Another way of thinking about the weighting by K is that as the measurement error covariance R approaches zero, the actual measurement $z_k$ is "trusted" more and more, while the predicted measurement $H\hat{x}_k^-$ is trusted less and less. On the other hand, as the a priori estimate error covariance $P_k^-$ approaches zero the actual measurement $z_k$ is trusted less and less, while the predicted measurement $H\hat{x}_k^-$ is trusted more and more.

The justification for (1.7) is rooted in the probability of the a priori estimate $\hat{x}_k^-$ conditioned on all prior measurements $z_k$. For now, let it suffice to point out that the Kalman filter maintains the first two moments of the state distribution, $$E[x_k] = \hat{x}_k$$

$$E[(x_k - \hat{x}_k)(x_k - \hat{x}_k)^T] = P_k$$

The a posteriori state estimate (1.7) reflects the mean (the first moment) of the state distribution—it is normally distributed if the conditions of (1.3) and (1.4) are met. The a posteriori estimate error covariance (1.6) reflects the variance of the state distribution (the second non-central moment). In other words, $$p(x_k | z_k) \sim N(E[x_k], E[(x_k - \hat{x}_k)(x_k - \hat{x}_k)^T]) = N(\hat{x}_k, P_k)$$

In general, the Kalman filter estimates a process by using a form of feedback control: the filter estimates the process state at some time and then obtains feedback in the form of (noisy) measurements. As such, the equations for the Kalman filter fall into two groups: time update equations and measurement update equations. The time update equations are responsible for projecting forward (in time) the current state and error covariance estimates to obtain the a priori estimates for the next time step. The measurement update equations are responsible for the feedback—i.e. for incorporating a new measurement into the a priori estimate to obtain an improved a posteriori estimate.

The time update equations can also be thought of as predictor equations, while the measurement update equations can be thought of as corrector equations. Indeed the final estimation algorithm resembles that of a predictor-corrector algorithm for solving numerical problems.

The specific equations for the time and measurement updates are presented below as "time update equations" (1.9 and 1.10) and "measurement update equations" (1.11, 1.12, and 1.13).

$$\hat{x}_k^- = A\hat{x}_{k-1} + Bu_{k-1} \quad (1.9)$$

$$P_k^- = AP_{k-1}A^T + Q \quad (1.10)$$

The time update equations project the state and covariance estimates forward from time step k−1 to step k. A and B are from (1.1), while Q is from (1.3). Initial conditions for the filter are discussed in the earlier references.

$$K_k = P_k^- H^T (H P_k^- H^T \pm R)^{-1} \quad (1.11)$$

$$\hat{x}_k = \hat{x}_k^- + K_k(z_k - H\hat{x}_k^-) \quad (1.12)$$

$$P_k = (I - K_k H) P_k^- \quad (1.13)$$

The first task during the measurement update is to compute the Kalman gain, $K_k$. Notice that the equation given here as (1.11) is the same as (1.8). The next step is to actually measure the process to obtain $z_k$, and then to generate an a posteriori state estimate by incorporating the measurement as in (1.12). Again (1.12) is simply (1.7) repeated here for completeness. The final step is to obtain an a posteriori error covariance estimate via (1.13). After each time and measurement update pair, the process is repeated with the previous a posteriori estimates used to project or predict the new a priori estimates.

In the actual implementation of the filter, the measurement noise covariance R is usually measured prior to operation of the filter. Measuring the measurement error covariance R is may be done by taking off-line sample measurements in order to determine the variance of the measurement noise.

The determination of the process noise covariance Q is generally more difficult as there is no ability to directly observe it. Sometimes a relatively simple process model can produce acceptable results if one "injects" enough uncertainty into the process via the selection of Q. Often times, superior filter performance (statistically speaking) can be obtained by tuning the filter parameters Q and R. The tuning is usually performed off-line, frequently with the help of another (distinct) Kalman filter in a process generally referred to as system identification.

The correction is weighted by a gain vector K that allows correction of the real-time estimates and the performance of the filter. The gain is calculated at each iteration from error predictions and uncertainties (noise) on states and measurements. The filter dynamic control is then based on the initialization of the noise matrices of states Q and measurements R, as well as through the initialization of the matrix of error covariance P. In general, the Kalman filter algorithm may comprise two phases: the first concerns the initialization of the matrices P, Q, and R, and the second concerns the observation which is composed of two steps at each sampling interval. First, the algorithm predicts the value of the present state, output, and error covariance. Second, by using a measurement of the physical system output, it corrects the state estimate and error covariance.

In the present case, the battery 101 may be modeled according to an open circuit voltage $V_{OC}$, an ohmic resistance, represented by a first resistor R1, voltage across the first resistor $V_1$, a polarization resistance, represented by a second resistor R2, a polarization capacitance, represented by capacitor C2, the voltage across the parallel-connected capacitor and resistor $V_2$, output voltage $V_T$, and current i. Characteristics of the present battery model may be represented according to the following:

$$V_T = V_{OC} - V_1 - V_2 = V_{OC} - R1 \cdot i - V_2, \quad \text{(Equation 4)}$$

$$\frac{dV_2}{dt} = \dot{V}_2 = \frac{i}{C2} - \frac{V_2}{C2 \cdot R2}, \quad \text{(Equation 5)}$$

$$\frac{dV_{OC}}{dt} = \dot{V}_{OC}^* = \frac{i}{C_{OCV}}, \quad \text{(Equation 6)}$$

$$\frac{d(SOC)}{dt} = S\dot{O}C = \frac{i}{\mu C_{OCV}}, \quad \text{(Equation 7)}$$

$$\begin{bmatrix} S\dot{O}C \\ \dot{V}_2 \end{bmatrix} = \begin{bmatrix} \dfrac{i}{\mu C_{OCV}} \\ -\dfrac{1}{R2 \cdot C2} V_2 + \dfrac{i}{C2} \end{bmatrix}, \quad \text{(Equation 8)}$$

where Equation 8 is derived from Equations 5 and 7.

The system input is defined as: u(t)=i, and the system output is defined as: y(t)=$V_T$.

Above, Equation 8 and Equation 4 are state equations and observation equation for a lithium ion battery model, discretization for continuous equation, and SOC calculation.

Kalman filtering algorithm can be divided into two parts as described previously: 1) predict system status, system output, and error; and 2) correct the current state estimate value based on system output value.

According to Equation 8 and Equation 4, the system state equation can be written as:

$$X = [X_1, X_2]^T \quad \text{(Equation 9),}$$

where $X_1(t)$=SOC, $X_2(t)$=$V_2$.

Therefore, the battery model can be written as:

$$\dot{x} = f(x,u) + w \quad \text{(Equation 10),}$$

$$y = g(x,u) + v \quad \text{(Equation 11),}$$

where w and v represent error, and $$f(x, u) = \begin{bmatrix} \dfrac{u}{\mu C_{OCV}} \\ -\dfrac{1}{R2 \cdot C2} x_2 + \dfrac{1}{C2} u \end{bmatrix}, \quad \text{(Equation 12)}$$

$$g(x, u) = \mu x_1 - x_2 - R1u + c, \quad \text{(Equation 13)}$$

where c is a constant and μ is a coefficient.

Taylor series expansion may be used to linearize Equation 10 and Equation 11. The model after linearization is:

$$\dot{x} = A_t \cdot x + B_t \cdot u + w,$$

$$\dot{y} = C_t \cdot x + D_t \cdot u + v,$$

where:

$$A_t = \frac{\partial f(x, u)}{\partial x} \bigg| x(t), u(t) = \begin{bmatrix} 0 & 0 \\ 0 & -\dfrac{i}{R2 \cdot C2} \end{bmatrix}$$

-continued $$B_t = \frac{\partial f(x, u)}{\partial u} \bigg| x(t), u(t) = \begin{bmatrix} \dfrac{1}{\mu \cdot C_{OCV}} \\ \dfrac{1}{C2} \end{bmatrix}$$

$$C_t = \frac{\partial g(x, u)}{\partial x} \bigg| x(t), u(t) = [\mu \quad 1]$$

$$D_t = \frac{\partial g(x, u)}{\partial u} \bigg| x(t), u(t) = R1$$

After discretization, the model can be expressed as:

$$x_{k+1} = A_k \cdot x_k + B_k \cdot u_k + w_k,$$

$$y_k = C_k \cdot x_k + D_k \cdot u_k + v_k,$$

and the general Kalman filtering algorithm calculation steps are complete.

According to an exemplary embodiment, the Kalman filter 800 may be connected to an output terminal of the multiplexer 220 and configured to receive the selected current i from the multiplexer 220 and compute the SOC according to equations 4-13. The Kalman filter 800 may comprise a conventional Kalman filter 800 suitable for performing predictions and corrections based on known and theoretical variables and may be implemented in hardware, software, or a combination thereof.

The host system 115 may be configured to generate the control signal S1 and control the duty cycle of the control signal S1, which controls the switch 140, and thus control the flow of the charge current from the charger 105 to the battery 101. The control signal S1 may be a pulse-width modulated signal and referred to a charge pulse.

The host system 115 may further comprise any circuit and/or system suitable for generating a pulse-width modulated signal, such as a PMW controller (not shown), a timer (not shown), a waveform generator, flip flops, and the like.

Figure 3:
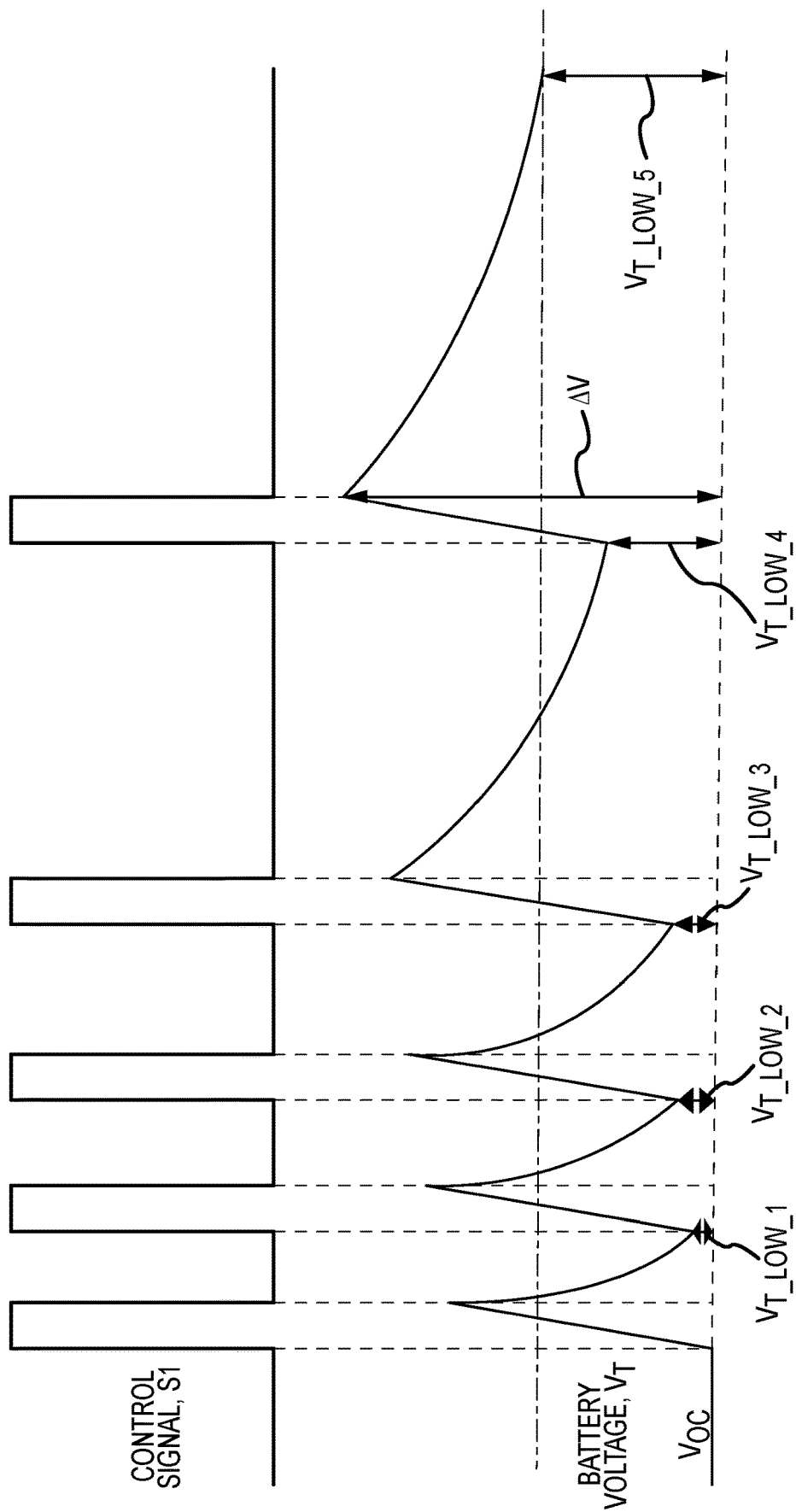
FIG. 3 is graph illustrating battery voltage characteristics during charging and discharging in accordance with an exemplary embodiment of the present technology.
Figure 5:
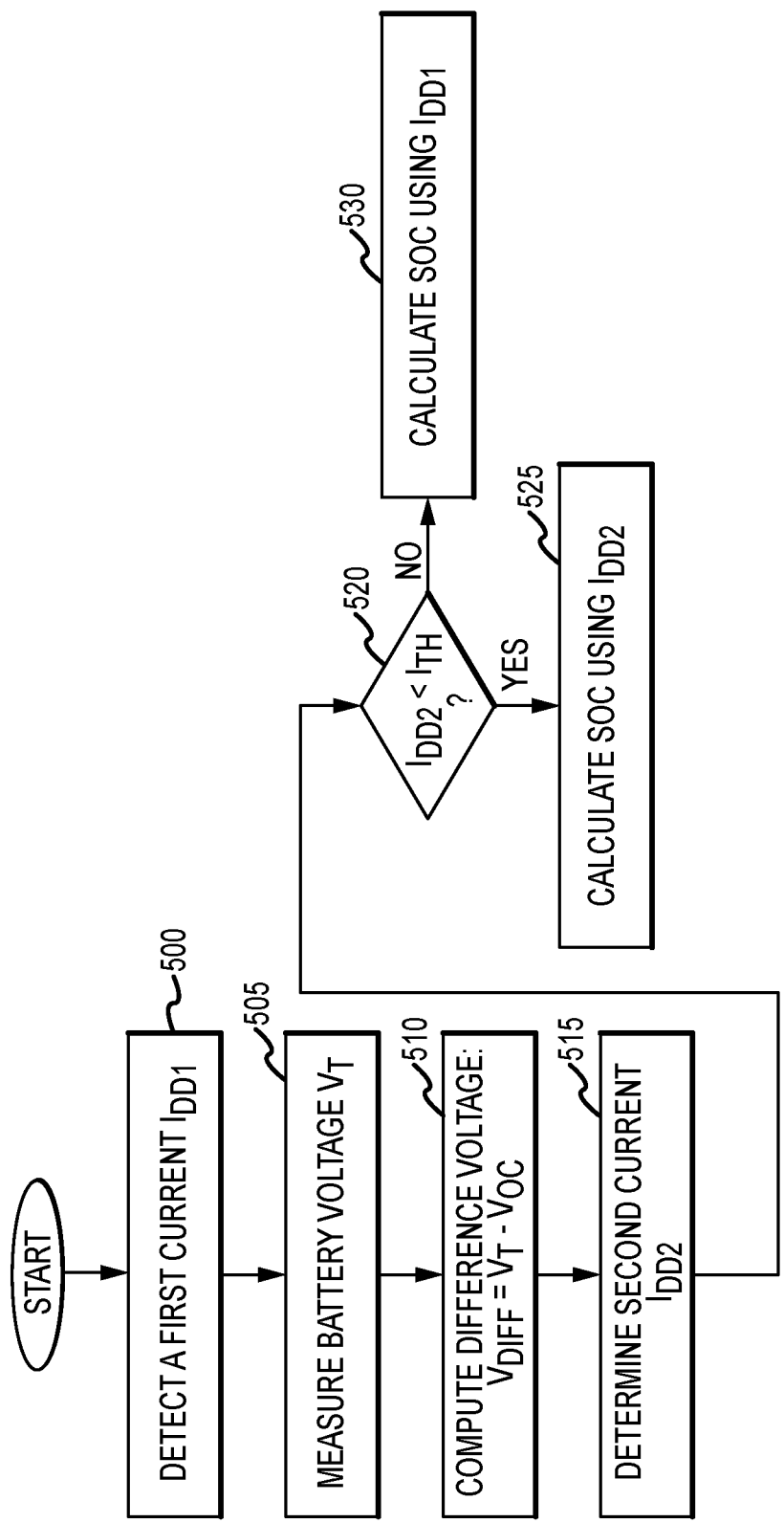
FIG. 5 is a flowchart for operating the battery system in accordance with an exemplary embodiment of the present technology.

In an exemplary operation, and referring to FIGS. 1, 2, and 5, the system 100 may determine or otherwise compute a SOC comprising detecting a first current $I_{DD1}$ (500), for example using the current sensor 125. Determining the SOC may further comprise measuring a battery voltage $V_T$ (505), for example using the voltage detector 120. According to an exemplary embodiment, measuring the battery voltage $V_T$ may occur at the end of a charge pulse when the battery voltage peaks. Determining the SOC may further comprise computing a difference voltage $V_{DIFF}$, where the difference voltage $V_{DIFF}$ is the difference between the battery voltage $V_T$ and the open circuit voltage $V_{OC}$ (510). For example, the fuel gauge 110 may utilize the arithmetic circuit 200 to perform a subtraction function. Determining the SOC may further comprise determining a second current $I_{DD2}$ (515), for example, by extracting the second current $I_{DD2}$ from the memory 130 according to the voltage difference $V_{DIFF}$. Determining the SOC may further comprise comparing the second current $I_{DD2}$ to a threshold current $I_{TH}$ to determine if the second current is less than the threshold current $I_{TH}$ (520). For example, the fuel gauge 110 may utilize the first comparator 210 to compare the second current $I_{DD2}$ to the threshold current $I_{TH}$ and generate the first comparator output $C_{OUT\_1}$ according to the comparison. If the second current $I_{DD2}$ is less than the threshold current $I_{TH}$, then the SOC may be calculated using the second current $I_{DD2}$. If the second current is not less than the threshold current, then the SOC may be calculated using the first current $I_{DD1}$. For example, the multiplexer 220 may and selectively transmit one of the first current $I_{DD1}$ and the second current $I_{DD2}$ to the SOC calculator 225 according to the first comparator output $C_{OUT\_1}$, wherein the SOC calculator 225 uses the selected current in the prediction and correction algorithm, as described above. The present method may assume that if the second current $I_{DD2}$ is greater than the threshold current $I_{TH}$, then the battery voltage $V_T$ is experiencing hysteresis (as illustrated in FIG. 3), and therefore, the second current $I_{DD2}$ value has errors and the first current $I_{DD1}$ may be more suitable for yielding more accurate predictions of the SOC.

Figure 6:
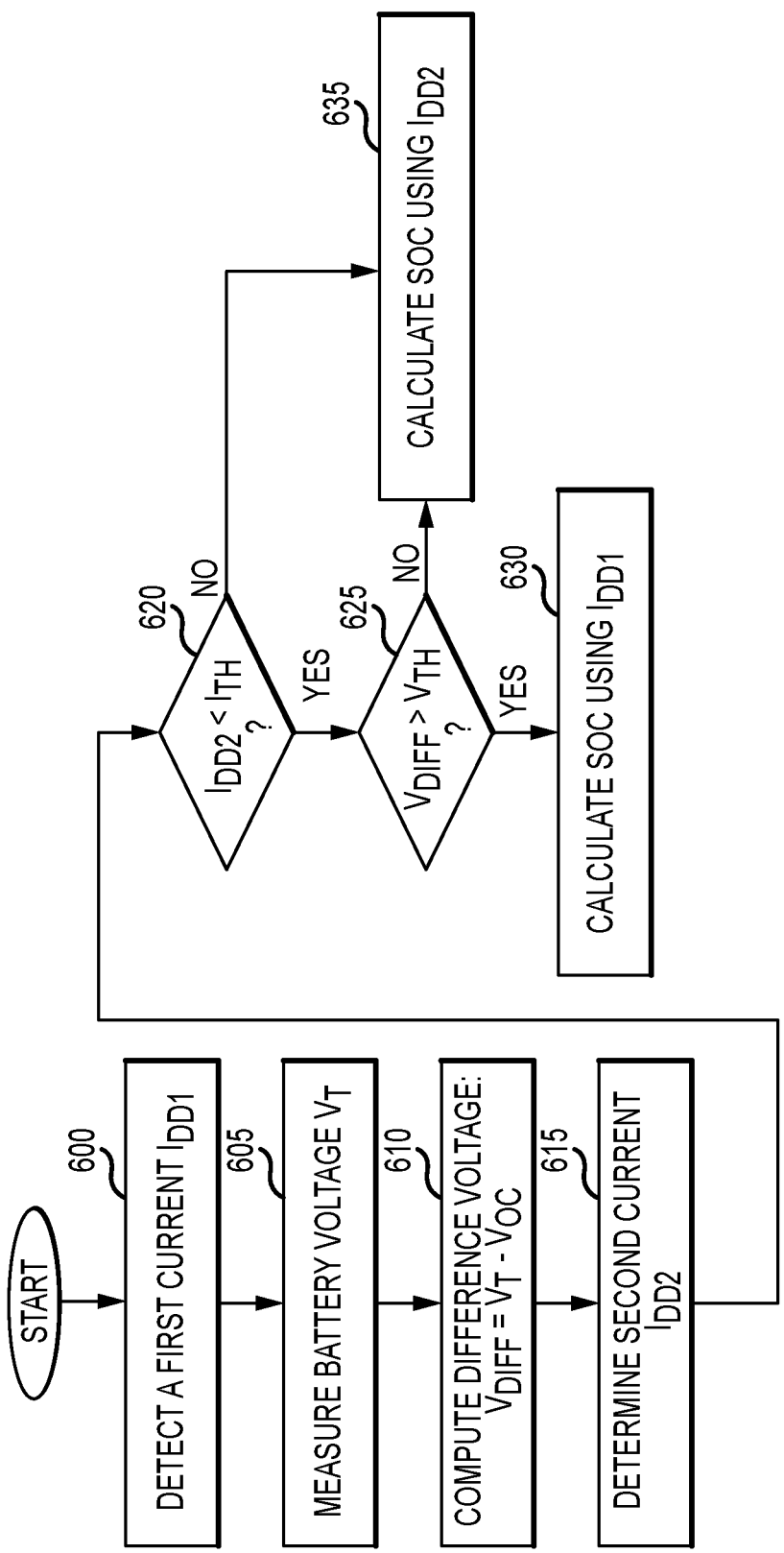
FIG. 6 is an alternative flowchart for operating the battery system in accordance with an exemplary embodiment of the present technology.

In an alternative operation, and referring to FIGS. 1, 2, and 6, the system 100 may determine or otherwise compute a SOC comprising detecting a first current $I_{DD1}$ (600), for example using the current sensor 125. Determining the SOC may further comprise measuring a battery voltage $V_T$ (605), for example using the voltage detector 120. According to an exemplary embodiment, measuring the battery voltage $V_T$ may occur at the end of a charge pulse when the battery voltage peaks. Determining the SOC may further comprise computing a difference voltage $V_{DIFF}$, where the difference voltage $V_{DIFF}$ is the difference between the battery voltage $V_T$ and the open circuit voltage $V_{OC}$ (610). For example, the fuel gauge 110 may utilize the arithmetic circuit 200 to perform a subtraction function. Determining the SOC may further comprise determining a second current $I_{DD2}$ (615), for example, by extracting the second current $I_{DD2}$ from the memory 130 according to the voltage difference $V_{DIFF}$. Determining the SOC may further comprise comparing the second current $I_{DD2}$ to a threshold current $I_{TH}$ to determine if the second current is less than the threshold current $I_{TH}$ (620). For example, the fuel gauge 110 may utilize the first comparator 210 to compare the second current $I_{DD2}$ to the threshold current $I_{TH}$ and generate the first comparator output $C_{OUT\_1}$ according to the comparison. Determining the SOC may further comprise comparing the difference voltage $V_{DIFF}$ to a threshold voltage $V_{TH}$ to determine if the difference voltage $V_{DIFF}$ is greater than the threshold voltage $V_{TH}$ (625). For example, the fuel gauge 110 may utilize the second comparator 215 to compare the difference voltage $V_{DIFF}$ to the threshold voltage $V_{TH}$ and generate the second comparator output $C_{OUT\_2}$ according to the comparison.

If the second current $I_{DD2}$ is less than the threshold current $I_{TH}$, and the difference voltage is greater than the threshold voltage, then the SOC may be calculated using the first current $I_{DD1}$ (630). Alternatively, if the second current $I_{DD2}$ is not less than the threshold current $I_{TH}$ or the difference voltage $V_{DIFF}$ is less than the threshold voltage $V_{TH}$, then the SOC may be calculated using the second current $I_{DD2}$ (635). For example, the multiplexer 220 may selectively transmit one of the first current $I_{DD1}$ and the second current $I_{DD2}$ to the SOC calculator 225 according to the first comparator output $C_{OUT\_1}$ and the second comparator output $C_{OUT\_2}$, wherein the SOC calculator 225 uses the selected current in the prediction and correction algorithm, as described above. The present method used both current and voltage parameters to determine if the battery is experiencing hysteresis. In general, if the second current $I_{DD2}$ is greater than or equal to the threshold current $I_{TH}$, or the difference voltage $V_{DIFF}$ is less than the threshold voltage, then the battery voltage $V_T$ is not experiencing hysteresis and the system may use second current $I_{DD2}$ to determine the SOC. However, if the second current $I_{DD2}$ is less than the threshold current $I_{TH}$, but the difference voltage $V_{DIFF}$ is greater than the threshold voltage $V_{TH}$, then the battery voltage $V_T$ may be experiencing hysteresis (as illustrated in FIG. 3), and therefore, the second current $I_{DD2}$ value has errors and the first current $I_{DD1}$ may be more suitable for yielding more accurate predictions of the SOC.

According to various embodiments, the threshold voltage $V_{TH}$ may be selected based on the second current $I_{DD2}$ value. For example, and referring to FIG. 7, if the second current $I_{DD2}$ is 0.1 A, then the threshold voltage $V_{TH}$ is 13 mV. However, if the second current $I_{DD2}$ is 2 A, then the threshold voltage $V_{TH}$ is 250 mV.

In general, and referring to FIG. 3, battery voltage hysteresis is a phenomenon in which the output voltage of the battery during a non-charging period does not return to the open circuit voltage $V_{OC}$, and as charging continues, the difference between the output voltage and the open circuit voltage $V_{OC}$ increases with each charge cycle. For example, at the end of the first charge cycle, the difference between the battery voltage and the open circuit voltage is given by $V_{T\_LOW\_1}$, at the end of the second charge cycle, the difference between the battery voltage and the open circuit voltage is given by $V_{T\_LOW\_2}$, at the end of the third charge cycle, the difference between the battery voltage and open circuit voltage is given by $V_{T\_LOW\_3}$, and at the end of the fourth charge cycle, the difference between the battery voltage and the open circuit voltage is given by $V_{T\_LOW\_4}$, where $V_{T\_LOW\_1} < V_{T\_LOW\_2} < V_{T\_LOW\_3} < V_{T\_LOW\_4}$. In addition, the difference between peak voltage values and the open circuit voltage $V_{OC}$ (i.e., $\Delta V$) also increases with each charge cycle.

Similarly, the same phenomenon of battery voltage hysteresis can be observed when the battery is discharging. In such a case, the output voltage of the battery during a discharging period does not return to the open circuit voltage $V_{OC}$, and as discharging continues, the difference between the output voltage and the open circuit voltage $V_{OC}$ increases with each discharge cycle.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus for charging a battery, comprising:
    a voltage detector configured to measure a voltage of the battery;
    a current sensor configured to detect a first current of the battery;
    a switch configured to selectively control a charge current for charging the battery;
    a charging controller configured to supply a control signal to the switch for controlling the charge current; and
    a processor configured to:
        compute a difference voltage from the measured voltage and an open circuit voltage;
        determine a second current of the battery based on the difference voltage;
        generate a first output comprising comparing the second current to a predetermined threshold current;
        select one of the first current and the second current based on the first output;
        compute a state of charge of the battery using a prediction and correction algorithm and the selected current; and
        communicate the state of charge of the battery to the charging controller.

2. The apparatus according to claim 1, further comprising a memory configured to store battery data indicating a relationship between voltage values and current values.

3. The apparatus according to claim 1, wherein:
    the processor selects the first current if the second current is greater than or equal to the threshold current; and
    the processor selects the second current if the second current is less than the threshold current.

4. The apparatus according to claim 1, wherein the processor is further configured to compare the difference voltage to a threshold voltage.

5. The apparatus according to claim 4, wherein:
    the processor selects the second current if the second current is greater than or equal to the threshold current or if the difference voltage is less than or equal to the threshold voltage; and
    the processor selects the first current if the second current is less than the threshold current and the difference voltage is greater than the threshold voltage.

6. The apparatus according to claim 1, wherein the processor comprises a multiplexer to select one of the first current and the second current based on the first output.

7. The apparatus according to claim 1, wherein the processor comprises a Kalman Filter to compute the state of charge of the battery using the selected current.

8. The apparatus according to claim 1, wherein the processor comprises a comparator to compare the second current to the predetermined threshold current.

9. The apparatus according to claim 1, wherein determining the second current comprises: accessing a memory and selecting the second current that corresponds to the difference voltage.

10. A method for charging a battery, comprising:
    detecting a first current of the battery;
    measuring a voltage of the battery;
    computing a difference voltage based on the measured voltage and an open circuit voltage;
    determining a second current of the battery based on the difference voltage;
    comparing the second current to a predetermined threshold current;
    comparing the measured voltage to a predetermined voltage; and
    calculating a state of charge of the battery comprising executing an algorithm using the first current if:
        the second current is less than the predetermined threshold current; and
        the difference voltage is greater than the predetermined voltage; and
        otherwise using the second current;
    communicating the state of charge of the battery to a charging controller;
    generating, by the charging controller, a control signal for controlling a charge current for charging the battery; and
    selectively controlling the charge current for charging the battery in response to the control signal from the charging controller.

11. The method according to claim 10, wherein the algorithm performs prediction and correction.

12. The method according to claim 10, wherein determining the second current comprises extracting the second current from a look-up table based on the difference voltage.

13. The method according to claim 10, wherein detecting the first current comprises measuring a voltage across a sense resistor.

14. A system for battery charging, comprising:
    a battery;
    a switch configured to selectively control a charge current for charging the battery;
    a charging controller configured to supply a control signal to the switch for controlling the charge current; and
    a fuel gauge connected to the battery and comprising:
        a voltage detector configured to measure a voltage of the battery;
        a current sensor configured to detect a first current of the battery;
        a memory for storing a look-up table comprising relational battery data; and a processor connected to the voltage detector, the current sensor, and the memory, wherein the processor comprises:
 an arithmetic circuit configured to compute a difference voltage of the measured voltage and an open circuit voltage;
 a selector circuit configured to extract a second current from the memory according to the difference voltage;
 a first comparator configured to compare the second current to a predetermined threshold current and generate a first comparator output based on the comparison;
 a multiplexer configured to output one of the first current and the second current based on the first comparator output; and
 a state of charge calculator connected to an output terminal of the multiplexer and configured to compute a state of charge of the battery using the output current; and
wherein the processor is configured to communicate the state of charge of the battery to the charging controller.

15. The system according to claim 14, wherein the relational battery data comprises voltage values and corresponding current values.

16. The system according to claim 14, wherein:
 the multiplexer outputs the first current if the second current is greater than or equal to the predetermined threshold; and
 the multiplexer outputs the second current if the second current is less than the predetermined threshold.

17. The system according to claim 14, further comprising a second comparator configured to compare the difference voltage to a predetermined voltage and generate a second comparator output based on the comparison.

18. The system according to claim 17, wherein the multiplexer outputs one of the first current and the second current based on the second comparator output.

19. The system according to claim 17, wherein:
 the multiplexer outputs the second current if the second current is greater than or equal to the predetermined threshold or if the difference voltage is less than or equal to the predetermined voltage; and
 the multiplexer outputs the first current if the second current is less than the predetermined threshold and the difference voltage is greater than the predetermined voltage.

20. The system according to claim 14, wherein the current sensor is configured to detect the first current by measuring a voltage across a sense resistor connected to the battery.

* * * * *